United States Patent
Nishimura

(10) Patent No.: US 9,680,444 B2
(45) Date of Patent: Jun. 13, 2017

(54) MULTIPLEXER WITH FILTERS AND RESONANT CIRCUIT

(71) Applicant: TAIYO YUDEN CO., LTD., Tokyo (JP)

(72) Inventor: Gohki Nishimura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1 day.

(21) Appl. No.: 14/793,495

(22) Filed: Jul. 7, 2015

(65) Prior Publication Data

US 2016/0112025 A1    Apr. 21, 2016

(30) Foreign Application Priority Data

Oct. 21, 2014   (JP) .................................. 2014-214872

(51) Int. Cl.
*H03H 7/46*    (2006.01)

(52) U.S. Cl.
CPC .................................. *H03H 7/463* (2013.01)

(58) Field of Classification Search
CPC ...... H03H 7/463; H03H 7/0115; H03H 9/725; H03H 9/706; H03H 11/344
USPC .................................. 333/132, 133, 193–196
See application file for complete search history.

(56) References Cited

U.S. PATENT DOCUMENTS

| 6,057,744 A * | 5/2000 | Ikada ................... H03H 9/0576 333/133 |
| 7,501,912 B2 * | 3/2009 | Jamneala ............. H03H 9/0004 333/132 |
| 2007/0046394 A1 * | 3/2007 | Inoue ................... H03H 9/0042 333/133 |
| 2011/0316647 A1 | 12/2011 | Ouchi et al. | |

FOREIGN PATENT DOCUMENTS

JP    2012-10164 A    1/2012

* cited by examiner

*Primary Examiner* — Robert Pascal
*Assistant Examiner* — Kimberly Glenn
(74) *Attorney, Agent, or Firm* — Chen Yoshimura LLP

(57) ABSTRACT

A multiplexer includes: a first filter connected between a common terminal and a first terminal; a second filter connected between the common terminal and a second terminal, and having a passband lower in frequency than a passband of the first filter; and a resonant circuit including: a first inductor and a capacitor connected in series between a first end and a second end of the resonant circuit, the first end being coupled to a node at which the common terminal diverges into the first filter and the second filter, the second end being coupled to the first filter, and a second inductor connected in parallel to the first inductor and the capacitor between the first end and the second end, wherein the passband of the first filter is higher in frequency than an antiresonant frequency of the resonant circuit.

8 Claims, 16 Drawing Sheets

FREQUENCY 1.5 GHz~2.5 GHz

FREQUENCY 1.5 GHz〜2.5 GHz

FREQUENCY 1.5 GHz~2.5 GHz

FREQUENCY 1.5 GHz〜2.5 GHz

FREQUENCY 1.5 GHz~2.5 GHz

US 9,680,444 B2

MULTIPLEXER WITH FILTERS AND RESONANT CIRCUIT

CROSS-REFERENCE TO RELATED APPLICATION

This application is based upon and claims the benefit of priority of the prior Japanese Patent Application No. 2014-214872, filed on Oct. 21, 2014, the entire contents of which are incorporated herein by reference.

FIELD

A certain aspect of the present invention relates to a multiplexer.

BACKGROUND

Multiplexers, such as duplexers, using a filter are employed in mobile communication terminals such as mobile phones. Japanese Patent Application Publication No. 2012-10164 (Patent Document 1) discloses connecting a resonator including an Interdigital Transducer (IDT) between a filter and a common terminal in a duplexer including two filters.

When a resonator including an IDT is employed as disclosed in Patent Document 1, the connection of the resonator between a first filter, which has a higher passband, of the two filters and the common terminal increases the loss of the resonator in the higher passband.

SUMMARY OF THE INVENTION

According to an aspect of the present invention, there is provided a multiplexer including: a first filter connected between a common terminal and a first terminal; a second filter connected between the common terminal and a second terminal and having a passband lower in frequency than a passband of the first filter; and a resonant circuit including: a first inductor and a capacitor connected in series between a first end and a second end of the resonant circuit, the first end being coupled to a node at which the common terminal diverges into the first filter and the second filter, the second end being coupled to the first filter, and a second inductor connected in parallel to the first inductor and the capacitor between the first end and the second end, wherein the passband of the first filter is higher in frequency than an antiresonant frequency of the resonant circuit.

DETAILED DESCRIPTION

Figure 1:
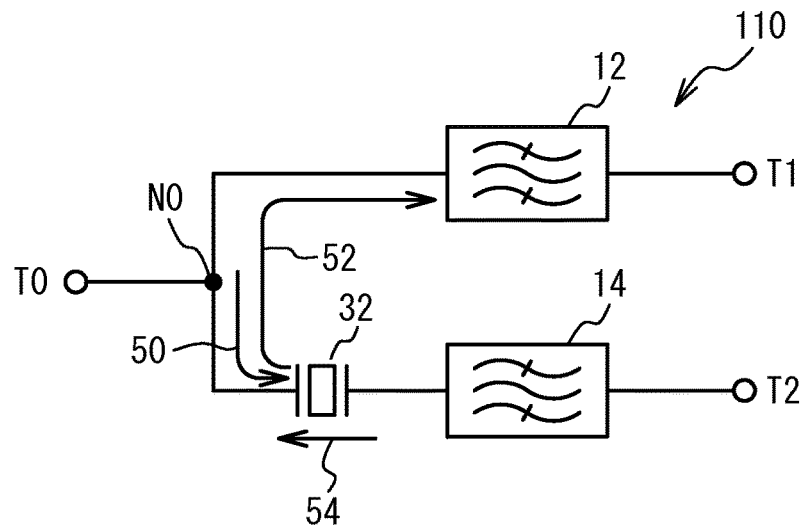
FIG. 1 is a block diagram of a duplexer in accordance with a first comparative example.

A description will first be given of a first comparative example. FIG. 1 is a block diagram of a duplexer in accordance with the first comparative example. As illustrated in FIG. 1, a duplexer 110 of the first comparative example includes filters 12, 14 and a resonator 32. The filter 12 (first filter) is connected between a common terminal T0 and a terminal T1 (first terminal). The filter 14 (second filter) is connected between the common terminal T0 and a terminal T2 (second terminal). A node N0 is a node at which the common terminal T0 diverges into the filters 12 and 14. The filter 14 has a passband lower in frequency than the passband of the filter 12. For example, the filter 12 is a receive filter, and the filter 14 is a transmit filter. The resonator 32 is connected between the node N0 and the filter 14. The resonator 32 includes an IDT formed on, for example, a piezoelectric substrate. The resonator 32 may be a piezoelectric thin film resonator.

Figure 2:
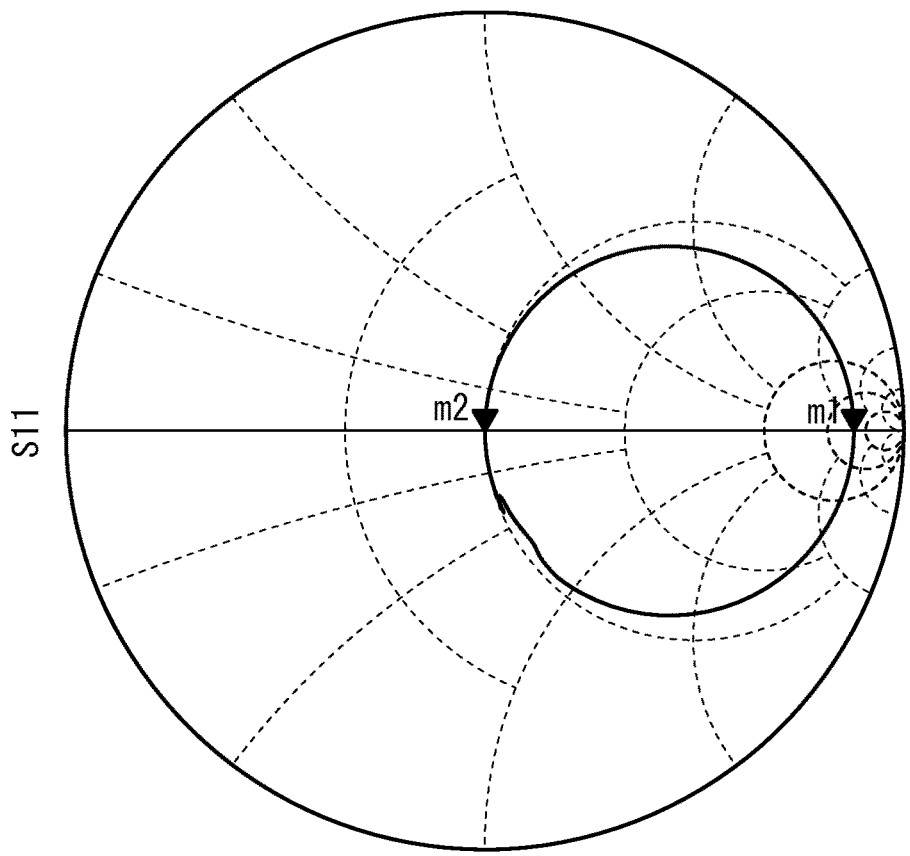
FIG. 2 is a Smith chart illustrating reflection characteristic S11 of a resonator in the first comparative example.
Figure 3:
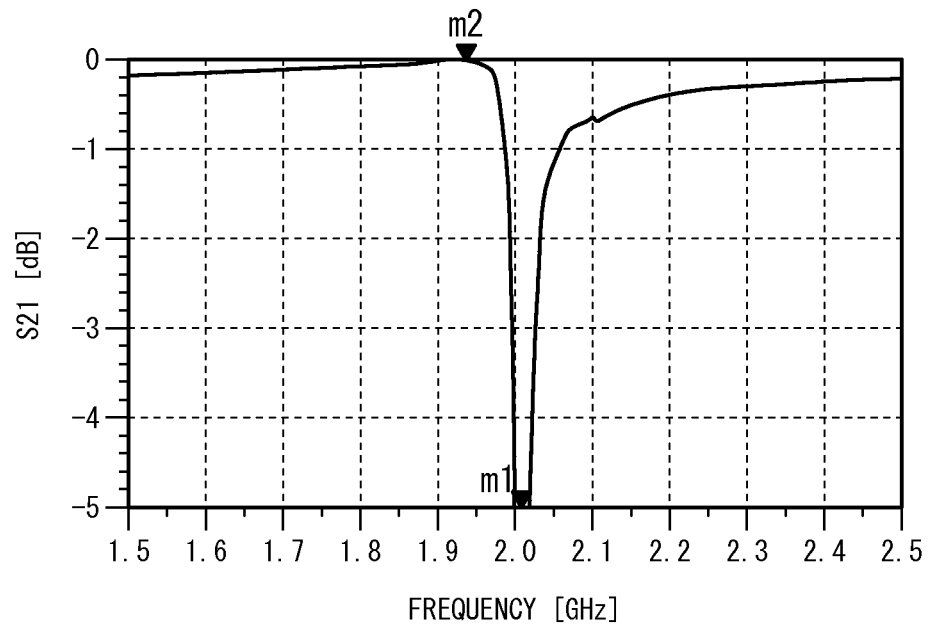
FIG. 3 is a diagram illustrating pass characteristic S21 of the resonator in the first comparative example.

FIG. 2 is a Smith chart illustrating reflection characteristic S11 of the resonator in the first comparative example. FIG. 3 is a diagram illustrating pass characteristic S21 of the resonator in the first comparative example. As illustrated in FIG. 2 and FIG. 3, the antiresonant frequency of the resonator 32 indicated by a marker m1 is 2.008 GHz. At the antiresonant frequency (m1), the magnitude of the reflection characteristic S11 is 0.889, the phase angle is −0.5 degree, and the pass characteristic S21 is −18.4 dB. The resonant frequency of the resonator 32 indicated by a marker m2 is 1.937 GHz. At the resonant frequency (m2), the magnitude of the reflection characteristic S11 is 0.006, the phase angle is 63.7 degrees, and the pass characteristic S21 is −0.02 dB.

The resonator 32 has the highest reflection coefficient and the greatest loss at the antiresonant frequency (m1). The loss sharply decreases at frequencies lower than the antiresonant frequency. At the resonant frequency (m2), the reflection coefficient is lowest, and the loss is smallest. The loss is also small at frequencies lower than the resonant frequency (m2). The loss moderately decreases at frequencies higher than the antiresonant frequency (m1). At frequencies higher than antiresonant frequency (m1) (e.g., from 2.1 to 2.2 GHz), the loss is large compared to at frequencies lower than the antiresonant frequency (m1) (e.g., from 1.8 to 1.9 GHz).

The first comparative example configures the filter 12 to have a passband near the antiresonant frequency (m1). The filter 14 is configured to have a passband lower in frequency than the antiresonant frequency. In FIG. 1, signals 52 with a frequency near the passband of the filter 12 of signals 50 transmitted through the resonator 32 from the common terminal T0 are reflected by the resonator 32, and transmitted through the filter 12 to reach the terminal T1. Thus, reduced is the loss of the signal in the passband of the filter 12 that reaches the terminal T1 from the common terminal T0.

Signals 54 in the passband of the filter 14 transmitted through the resonator 32 from the filter 14 are transmitted through the resonator 32 having a small insertion loss. Thus, an increase in insertion loss due to the provision of the resonator 32 can be reduced. Accordingly, the pass characteristic of the signal in the passband of the filter 14 that reaches the common terminal T0 from the terminal T2 is improved.

Figure 4:
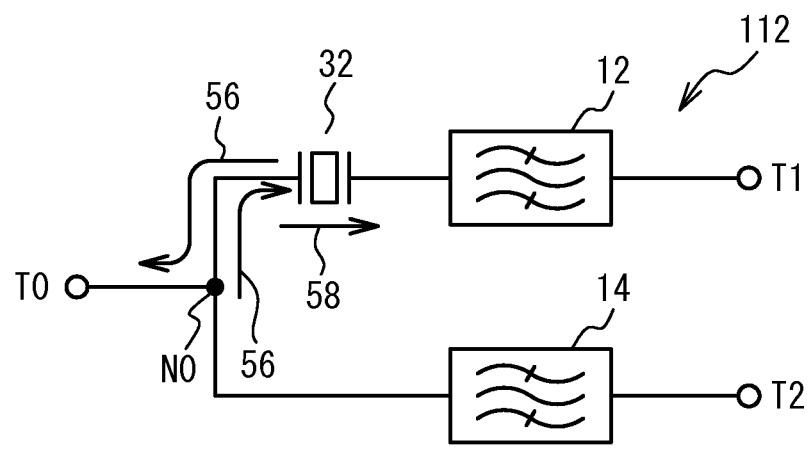
FIG. 4 is a block diagram of a duplexer in accordance with a second comparative example.

FIG. 4 is a block diagram of a duplexer in accordance with a second comparative example. As illustrated in FIG. 4, the resonator 32 is connected between the node N0 and the filter 12 in a duplexer 112. Other configurations are the same as those of the first comparative example, and thus the description is omitted. The filter 12 is configured to have a passband higher in frequency than the antiresonant frequency (m1), and the filter 14 is configured to have a passband around the antiresonant frequency (m1). Signals 56 in the passband of the filter 14 transmitted through the filter 14 from the terminal T2 are reflected by the resonator 32, and reach the common terminal T0 without leaking to the filter 12. Thus, the pass characteristic of the signal in the passband of the filter 14 that reaches the common terminal T0 from the terminal T2 is improved. Signals 58 in the passband of the filter 12 that reach the filter 12 from the common terminal T0 are transmitted through the resonator 32. As illustrated in FIG. 3, the loss of the resonator 32 is large at frequencies higher than the antiresonant frequency (m1). Thus, the pass characteristic of the signal 58 in the passband of the filter 12 that reaches the terminal T1 from the common terminal T0 deteriorates.

When the resonator 32 of the first comparative example is used to reflect signals in a lower passband and to pass signals in a higher passband as described above, the loss in the higher passband increases.

First Embodiment

Figure 5:
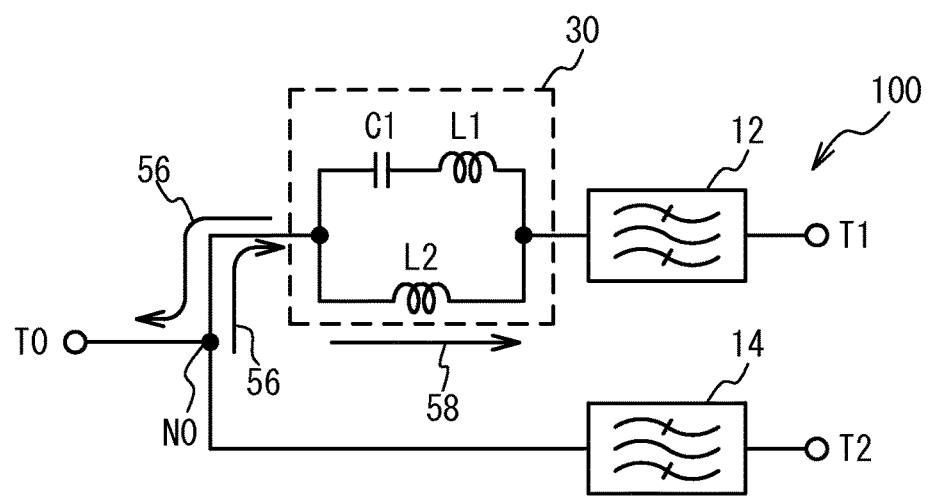
FIG. 5 is a block diagram of a duplexer in accordance with a first embodiment.

FIG. 5 is a block diagram of a duplexer in accordance with a first embodiment. As illustrated in FIG. 5, in a duplexer 100, a first end of a resonant circuit 30 is coupled to the node N0, and a second end is coupled to the filter 12. The resonant circuit 30 includes inductors L1, L2 and a capacitor C1. The inductor L1 and the capacitor C1 are connected in series between the first end and the second end of the resonant circuit 30. The inductor L2 is connected in parallel to the inductor L1 and the capacitor C1 between the first end and the second end of the resonant circuit 30. Other configurations are the same as those of the first comparative example, and thus the description is omitted.

The inductors L1 and L2 may be chip inductors. The capacitor C1 may be a chip capacitor. Moreover, the inductors L1, L2 and the capacitor C1 may be formed as an integrated passive component. Alternatively, the inductors L1, L2 and the capacitor C1 may be formed on a chip in which at least one of the filters 12 and 14 is formed. Alternatively, the inductors L1, L2 and the capacitor C1 may be formed in a wiring substrate on which a chip including at least one of the filters 12 and 14 formed therein is mounted.

Figure 6:
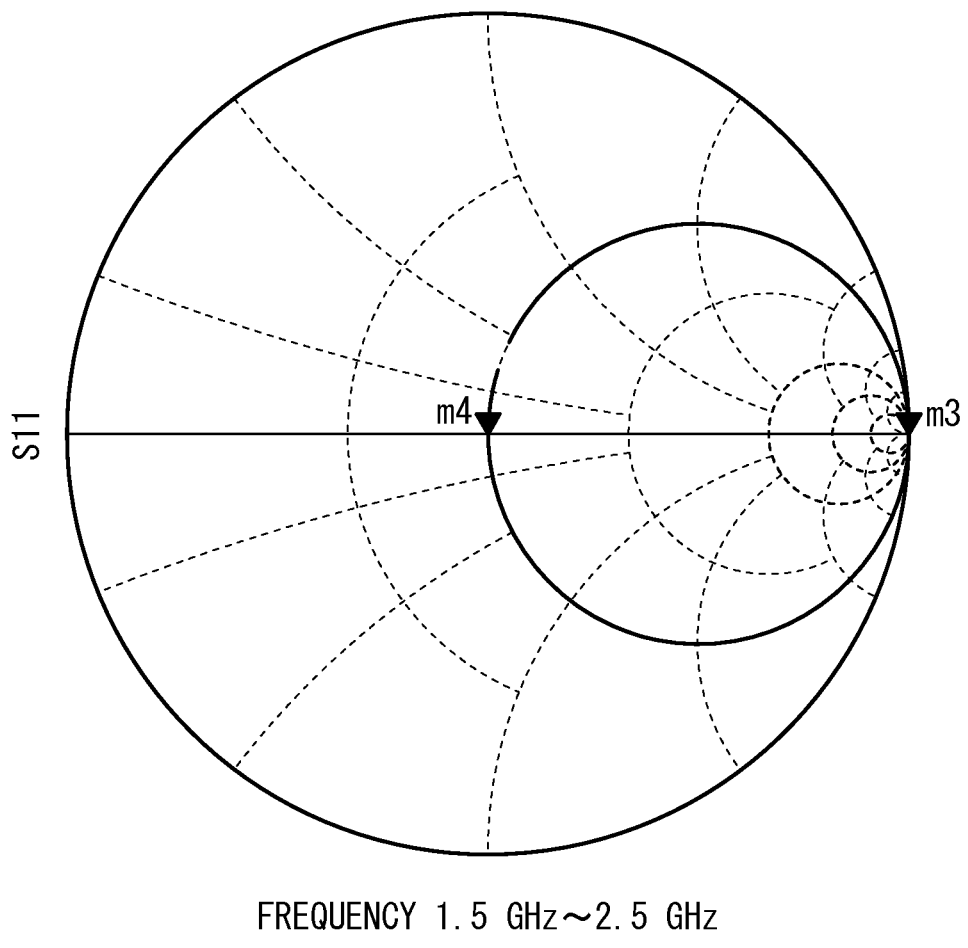
FIG. 6 is a Smith chart illustrating reflection characteristic S11 of a resonant circuit in the first embodiment.
Figure 7:
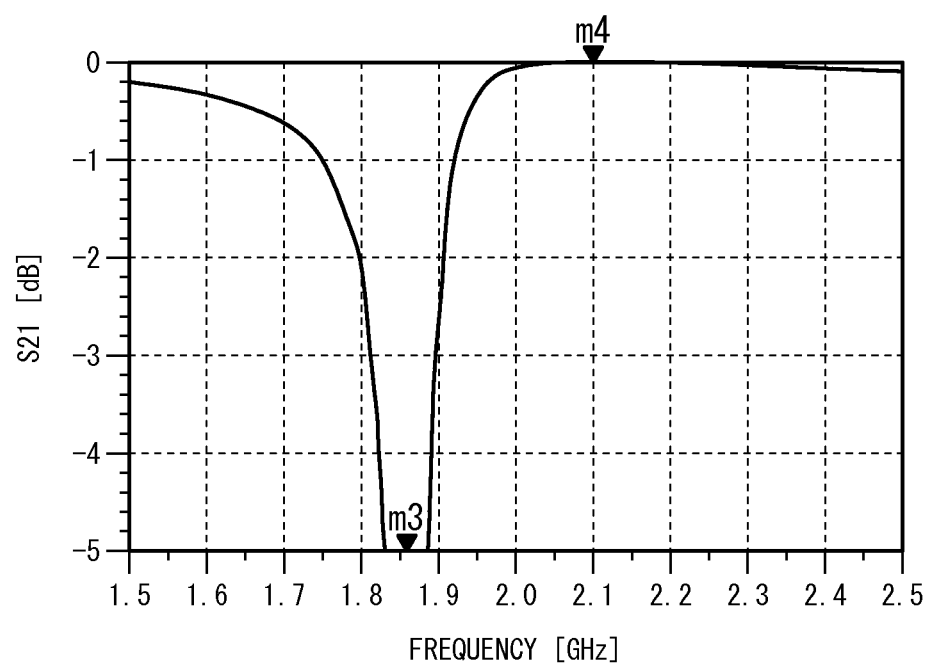
FIG. 7 is a diagram illustrating pass characteristic S21 of the resonant circuit in the first embodiment.

FIG. 6 is a Smith chart illustrating reflection characteristic S11 of the resonant circuit in the first embodiment. FIG. 7 is a diagram illustrating pass characteristic S21 of the resonant circuit in the first embodiment. As illustrated in FIG. 6 and FIG. 7, the antiresonant frequency of the resonant circuit 30 indicated by a marker m3 is 1.861 GHz. At the antiresonant frequency (m3), the magnitude of the reflection characteristic S11 is 1.000, the phase angle is 0.7 degree, the pass characteristic S21 is −38.4 dB. The resonant frequency of the resonant circuit 30 indicated by a marker m4 is 2.099 GHz. At the resonant frequency (m4), the magnitude of the reflection characteristic S11 is 0.005, the phase angle is 89.7 degrees, and the pass characteristic S21 is −0.00 dB.

The resonant circuit 30 has the highest reflection coefficient and the greatest loss at the antiresonant frequency (m3). The loss sharply decreases at frequencies higher than the antiresonant frequency (m3). At the resonant frequency (m4), the reflection coefficient is lowest, and the loss is smallest. The loss is also small at frequencies higher than the resonant frequency (m4). The loss moderately decreases at frequencies lower than the antiresonant frequency (m3). The loss is small at frequencies higher than the antiresonant frequency (m3) (e.g., from 2.1 to 2.2 GHz) compared to at frequencies lower than the antiresonant frequency (m3) (e.g., from 1.6 to 1.7 GHz).

The filter 12 is configured to have a passband near the resonant frequency (m4), and the filter 14 is configured to have a passband near the antiresonant frequency (m3). As illustrated in FIG. 5, as with in the second comparative example, the signal 56 in the passband of the filter 14 transmitted through the filter 14 to reach the resonant circuit 30 from the terminal T2 is reflected by the resonant circuit 30 and reaches the common terminal T0. Thus, the leakage of the signal 56 to the filter 12 is reduced, and thereby the pass characteristic of the signal in the passband of the filter 14 that reaches the common terminal T0 from the terminal T2 is improved. The signal 58 in the passband of the filter 12 that reaches the filter 12 from the common terminal T0 is transmitted through the resonant circuit 30. Compared to using the resonator 32 with pass characteristics of FIG. 3 as illustrated in FIG. 4 of the second comparative example, the loss of the resonant circuit 30 in the passband of the filter 12 is small. Thus, improved is the pass characteristic of the signal 58 in the passband of the filter 12 that reaches the terminal T2 from the common terminal T0.

The pass characteristics of the filters 12 and 14 were simulated. The filter 12 was assumed to be a receive filter for Band 1, and the filter 14 was assumed to be a transmit filter for Band 1. The filter 12 was assumed to be a double-mode filter using a surface acoustic wave resonator, and the filter 14 was assumed to be a ladder-type surface acoustic wave filter. The transmit band of Band 1 is from 1.92 GHz to 1.98 GHz, and the receive band of Band 1 is from 2.11 GHz to 2.17 GHz. The inductor L1 was assumed to have an inductance of 6.8 nH, the inductor L2 was assumed to have an inductance of 1.8 nH, and the capacitor C1 has a capacitance of 0.85 pF. An inductor with an inductance of 6.0 nH was assumed to be connected between the common terminal T0 and a ground as a matching circuit of the duplexer.

Figure 8:
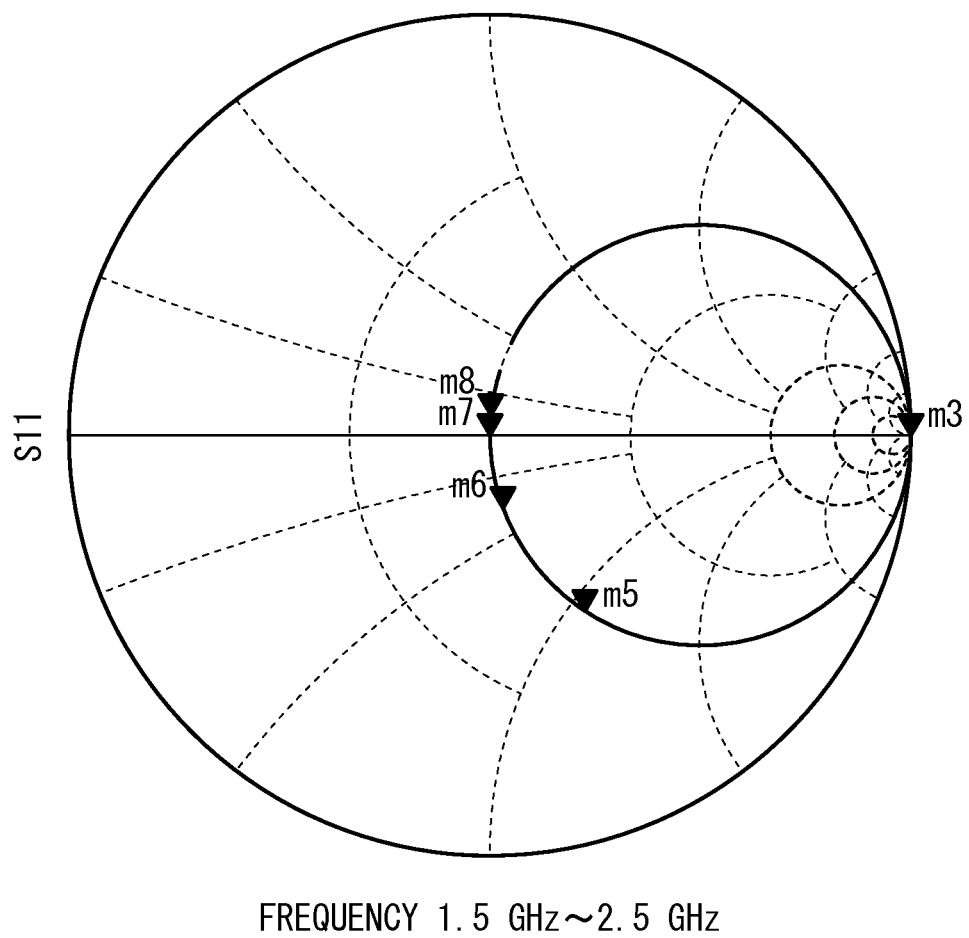
FIG. 8 is a Smith chart illustrating reflection characteristic S11 of a resonant circuit used in a simulation in the first embodiment.
Figure 9:
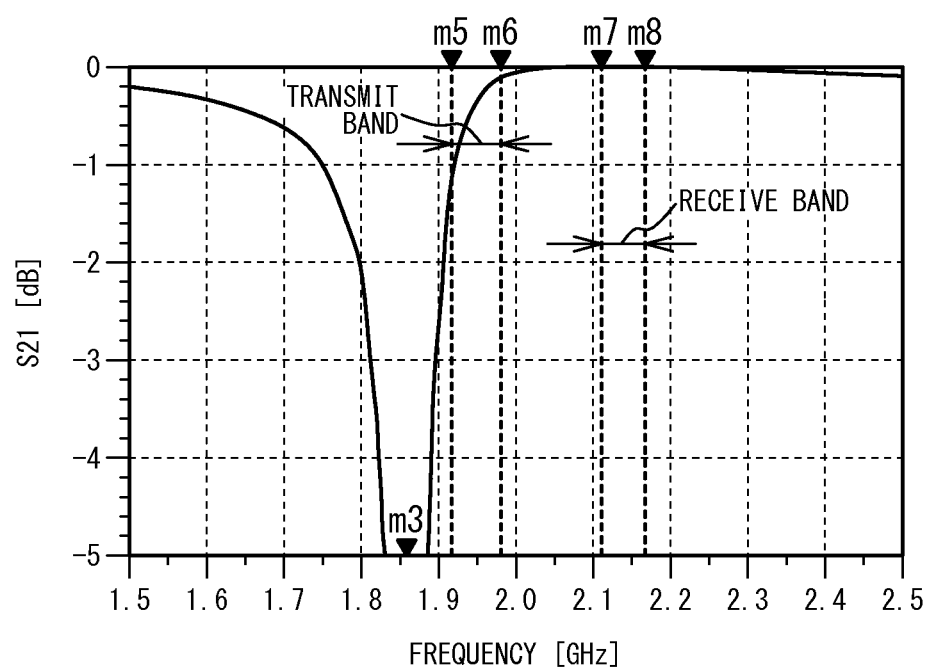
FIG. 9 is a diagram illustrating pass characteristic S21 of the resonant circuit used in the simulation in the first embodiment.

FIG. 8 is a Smith chart illustrating reflection characteristic S11 of a resonant circuit used in the simulation in the first embodiment. FIG. 9 is a diagram illustrating pass characteristic S21 of the resonant circuit used in the simulation in the first embodiment. As illustrated in FIG. 8 and FIG. 9, at the antiresonant frequency (m3), the magnitude of the reflection characteristic S11 is 1.000, the phase angle is 0.4 degree, and the pass characteristic S21 is −44.5 dB. At the lowest frequency of the transmit band of Band 1 (1.920 GHz indicated by a marker m5), the magnitude of the reflection characteristic S11 is 0.475, the phase angle is −61.6 degrees, and the pass characteristic S21 is −1.112 dB. At the highest frequency of the transmit band of Band 1 (1.980 GHz indicated by a marker m6), the magnitude of the reflection characteristic S11 is 0.177, the phase angle is −79.8 degrees, and the pass characteristic S21 is −0.138 dB. At the lowest frequency of the receive band of Band 1 (2.110 GHz indicated by a marker m7), the magnitude of the reflection characteristic S11 is 0.013, the phase angle is 89.2 degrees, and the pass characteristic S21 is −0.001 dB. At the highest frequency of the receive band of Band 1 (2.170 GHz indicated by a marker m8), the magnitude of the reflection characteristic S11 is 0.051, the phase angle is 87.1 degrees, and the pass characteristic S21 is −0.011 dB. As described above, in the passband of the filter 12 (i.e., in the receive band of Band 1), the reflection coefficient is low and the pass characteristic S21 is small. In the passband of the filter 14 (i.e., in the transmit band of Band 1), the reflection characteristic is large, and the pass characteristic is large. The antiresonant frequency of the resonant circuit 30 is not located in the passband of the filter 14.

Figure 10A:
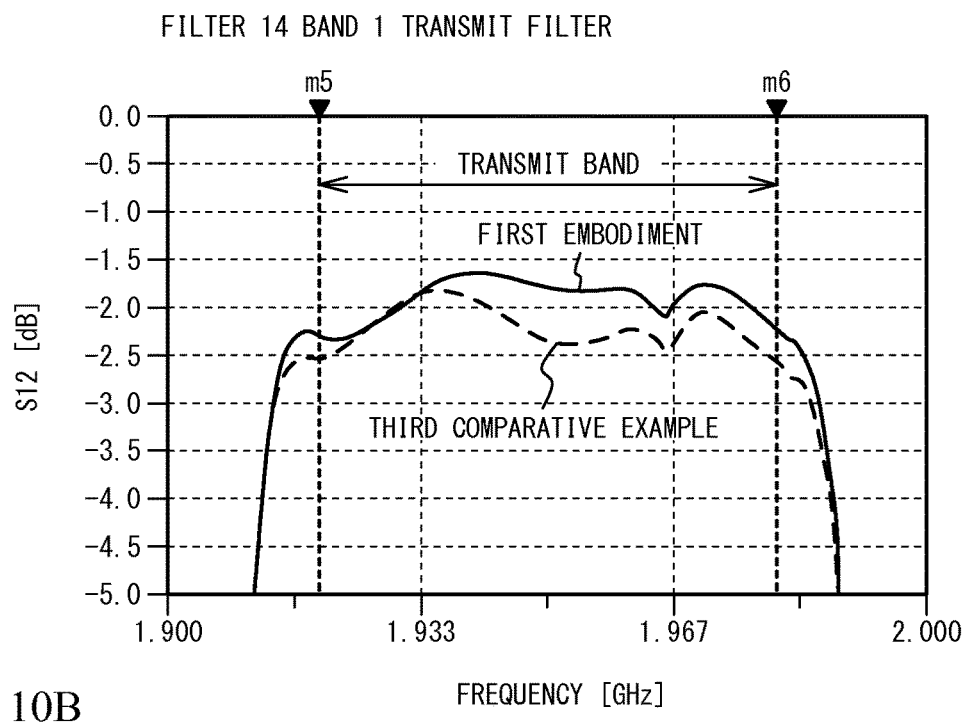
FIG. 10A is a diagram illustrating pass characteristics of transmit filters for Band 1 in the first embodiment and a third comparative example.
Figure 10B:
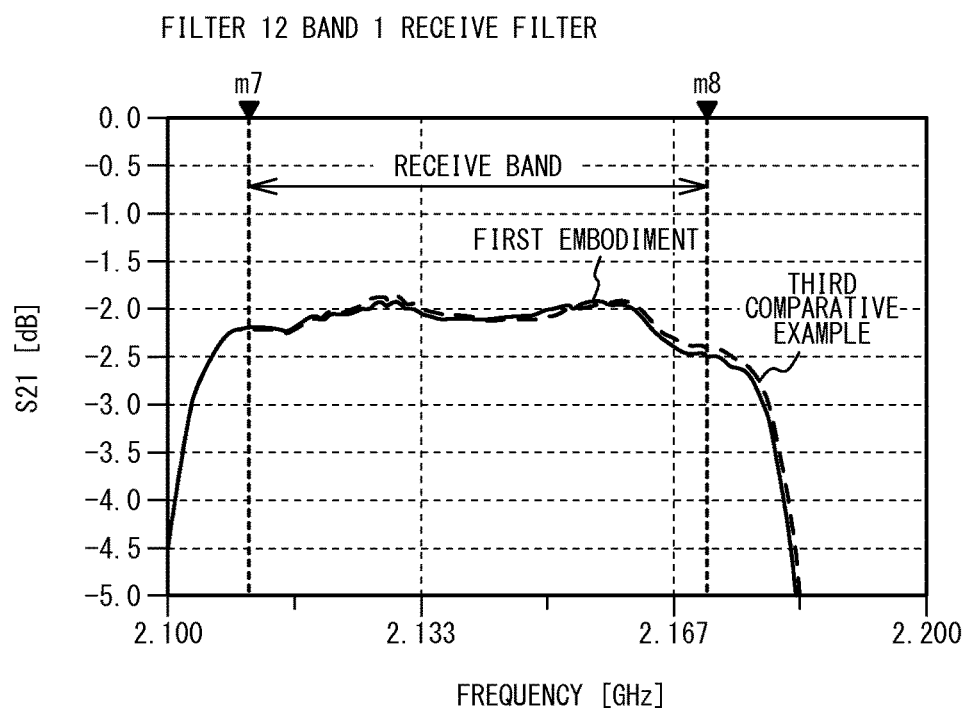
FIG. 10B is a diagram illustrating pass characteristics of receive filters for Band 1 in the first embodiment and the third comparative example.

FIG. 10A is a diagram illustrating pass characteristics of transmit filters for Band 1 in the first embodiment and a third comparative example, and FIG. 10B is a diagram illustrating pass characteristics of receive filters for Band 1. The pass characteristic of the transmit filter 14 for Band 1 corresponds to the pass characteristic of a signal that reaches the common terminal T0 from the terminal T2, and the pass characteristic of the receive filter 12 for Band 1 corresponds to the pass characteristic of a signal that reaches the terminal T1 from the common terminal T0. The third comparative example is a duplexer without the resonant circuit 30.

As illustrated in FIG. 10A, the loss in the passband of the transmit filter 14 for Band 1 in the first embodiment is less than that in the third comparative example by approximately 0.5 dB. This is because the signal 56 in the passband of the filter 14 transmitted through the filter 14 from the terminal T2 is reflected by the resonant circuit 30 and reaches the common terminal T0 without leaking to the filter 12, since the reflection coefficient of the resonant circuit 30 in the passband of the filter 14 is high. Thus, reduced is the leakage of the signal 56 to the filter 12. As illustrated in FIG. 10B, the loss in the passband of the receive filter 12 for Band 1 in the first embodiment is approximately the same as that in the third comparative example. This is because since the insertion loss of the resonant circuit 30 in the passband of the filter 12 is small, a signal in the passband of the filter 12 is not attenuated or reflected even when the resonant circuit 30 is inserted.

The first embodiment configures the resonant circuit 30 to include the inductor L1 (first inductor) and the capacitor C1 connected in series between the first end and the second end, and the inductor L2 (second inductor) connected in parallel to the inductor L1 and the capacitor C1 between the first end and the second end. This configuration enables to reduce the insertion loss at frequencies higher than the antiresonant frequency (m3) as illustrated in FIG. 9. The passband of the filter 12 (between m7 and m8) is higher in frequency than the antiresonant frequency (m3) of the resonant circuit 30. Thus, the loss of the resonant circuit 30 in the passband of the filter 12 (between m7 and m8) is small. Accordingly, the loss of the signal in the passband of the filter 12 (between m7 and m8) that reaches the terminal T1 from the common terminal T0 can be reduced. Moreover, the passband of the filter 14 (between m5 and m6) is lower in frequency than the passband of the filter 12 (between m7 and m8). Thus, the reflection coefficient of the resonant circuit 30 in the passband of the filter 14 (between m5 and m6) can be made to be high. This allows the resonant circuit 30 to reflect the signal 56 in the passband of the filter 14 (between m5 and m6) that leaks to the filter 12. Thus, the signal 56 transmitted through the filter 14 reaches the common terminal T0 without leaking to the filter 12. Accordingly, the loss of the signal in the passband of the filter 14 (between m5 and m6) that reaches the common terminal T0 from the terminal T2 can be reduced.

Figure 11:
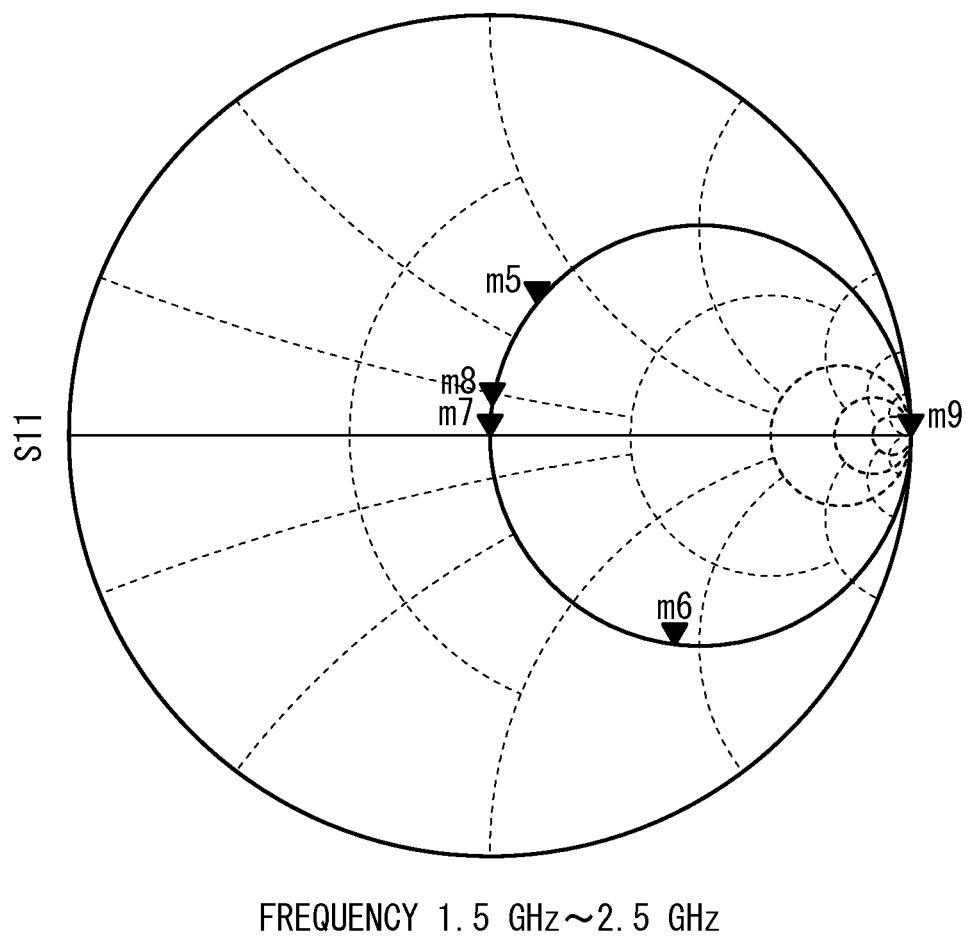
FIG. 11 is a Smith chart illustrating reflection characteristic S11 of a resonant circuit used in a simulation in a fourth comparative example.
Figure 12:
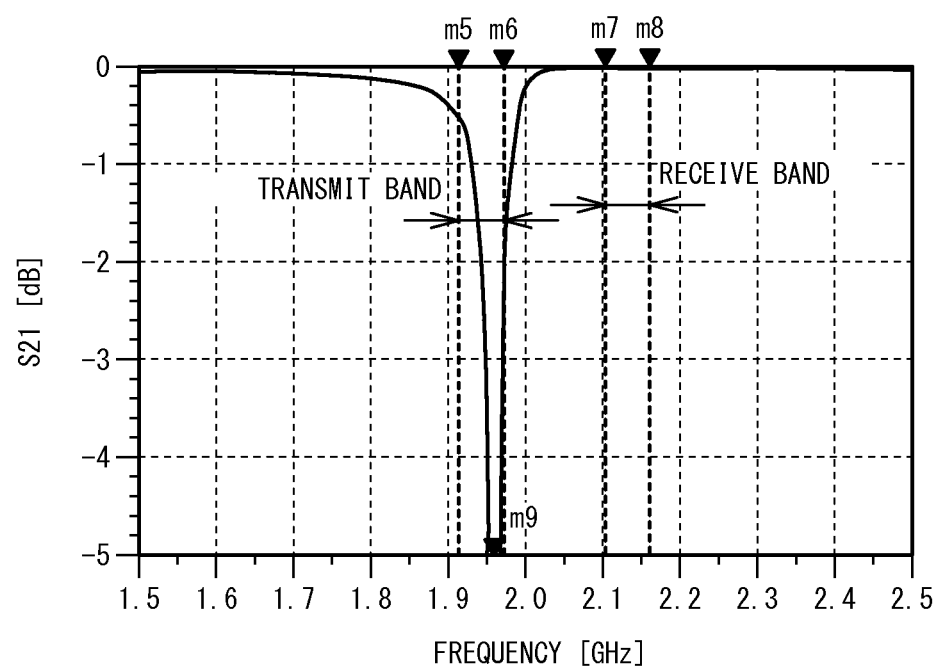
FIG. 12 is a diagram illustrating pass characteristic S21 of the resonant circuit used in the simulation in the fourth comparative example.

A simulation was performed on a fourth comparative example in which the antiresonant frequency of the resonant circuit 30 is located in the passband of the filter 14. FIG. 11 is a Smith chart illustrating reflection characteristic S11 of a resonant circuit used in the simulation in the fourth comparative example. FIG. 12 is a diagram illustrating pass characteristic S21 of the resonant circuit used in the simulation in the fourth comparative example. As illustrated in FIG. 11 and FIG. 12, the antiresonant frequency (m9) of the resonant circuit 30 is 1.968 GHz, and is located in the transmit band.

Figure 13A:
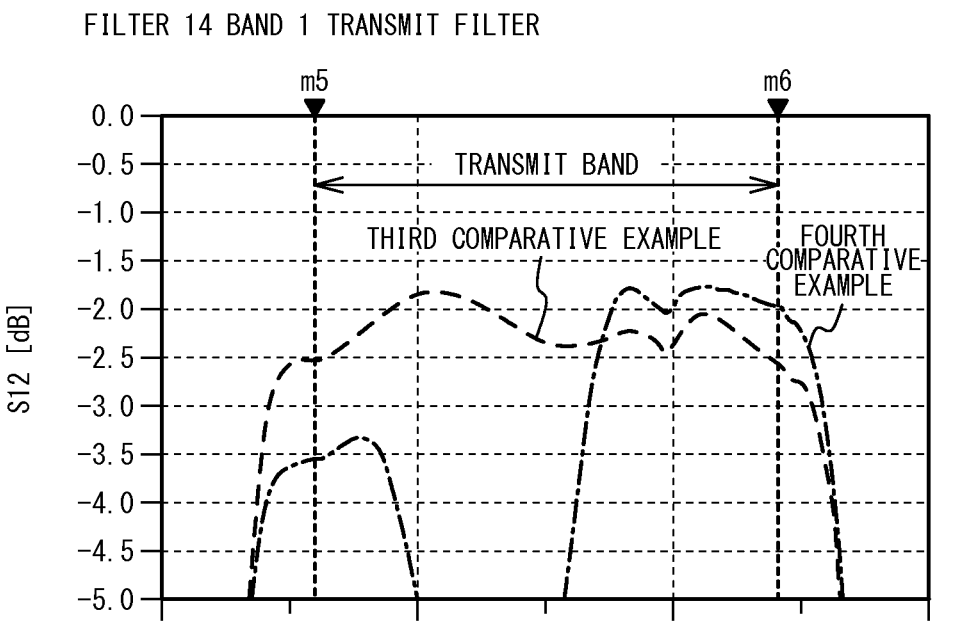
FIG. 13A is a diagram illustrating pass characteristics of transmit filters for Band 1 in the fourth comparative example and the third comparative example.
Figure 13B:
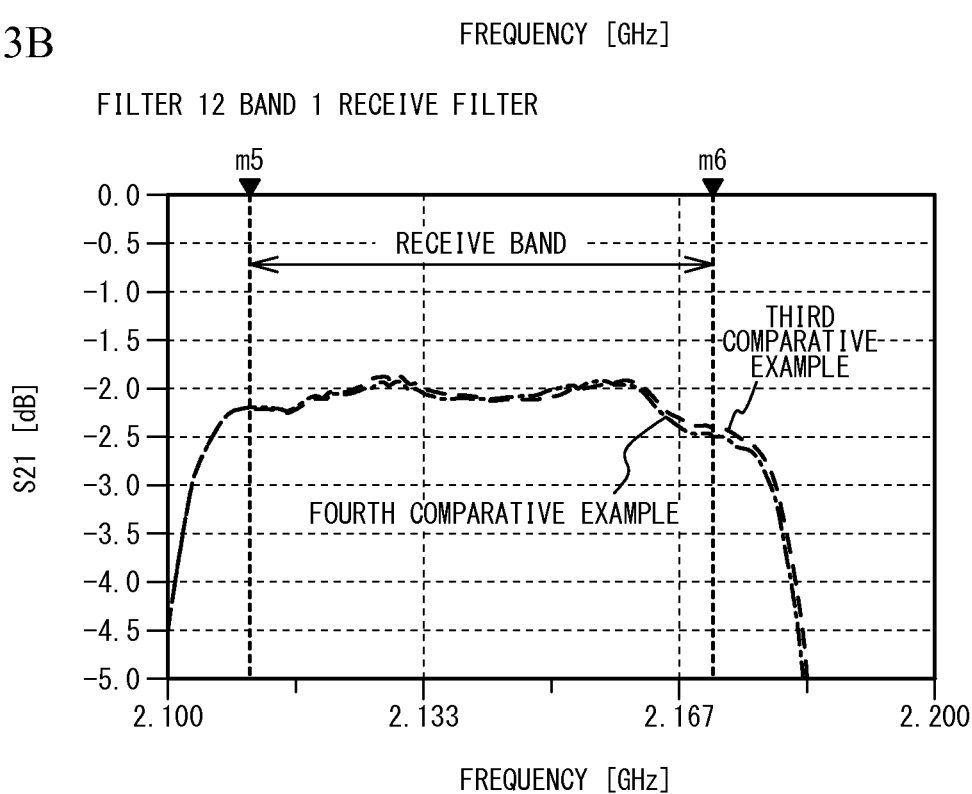
FIG. 13B is a diagram illustrating pass characteristics of receive filters for Band 1 in the fourth comparative example and the third comparative example.

FIG. 13A is a diagram illustrating pass characteristics of transmit filters 14 for Band 1 in the fourth comparative example and the third comparative example, and FIG. 13B is a diagram illustrating pass characteristics of the receive filters 12 for Band 1. As illustrated in FIG. 13A, in the fourth comparative example, a ripple is formed in the passband of the transmit filter 14 for Band 1 (i.e., in the transmit band of Band 1). As illustrated in FIG. 13B, the pass characteristic in the passband of the receive filter 12 for Band 1 (i.e., in the receive band) in the fourth comparative example is approximately the same as that in the third comparative example.

To increase the reflection coefficient of the resonant circuit 30 in the passband of the filter 14, the antiresonant frequency of the resonant circuit 30 is preferably in the passband of the filter 14 or near the passband of the filter 14. However, when the antiresonant frequency (m9) is located in the passband of the filter 14 (between m5 and m6) as illustrated in FIG. 12, a ripple may be formed in the passband of the filter 14 (between m5 and m6) as described in the fourth comparative example. Thus, the antiresonant frequency (m9) of the resonant circuit 30 is preferably not located in the passband of the filter 14 (between m5 and m6).

Moreover, as illustrated in FIG. 9, the passband of the filter 14 (between m5 and m6) is preferably higher in frequency than the antiresonant frequency (m3) of the resonant circuit 30. This configuration enables to make the reflection coefficient of the resonant circuit 30 in the passband of the filter 14 (between m5 and m6) greater than the reflection coefficient of the resonant circuit 30 in the passband of the filter 12 (between m7 and m8).

As described above, the antiresonant frequency of the resonant circuit 30 is preferably configured so that the reflection coefficient of the resonant circuit 30 in the passband of the filter 12 is less than the reflection coefficient of the resonant circuit 30 in the passband of the filter 14.

To make the resonant frequency higher than the antiresonant frequency, the resonator may be, for example, shunt-connected. However, when the resonator is shunt-connected, a part of the signal 56 in the passband of the filter 14 flows to a ground through the shunt-connected resonator. Thus, the loss of the signal 56 in the passband of the filter 14 that reaches the common terminal T0 from the terminal T2 is not sufficiently reduced. Accordingly, the resonant circuit 30 preferably does not have a pathway connected to a ground.

In the first embodiment, the filter 12 is a receive filter, and the filter 14 is a transmit filter. However, the filter 12 may be a transmit filter, and the filter 14 may be a receive filter. Moreover, both the filters 12 and 14 may be transmit filters, or receive filters.

The resonator 32 described in the first comparative example may be connected between the node N0 and the filter 14. This configuration allows the resonant circuit 30 to reduce the leakage of the signal in the passband of the filter 14 to the filter 12, and allows the resonator 32 to reduce the leakage of the signal in the passband of the filter 12 to the filter 14. Thus, the loss in both the passbands of the filters 12 and 14 can be further reduced.

Second Embodiment

Figure 14:
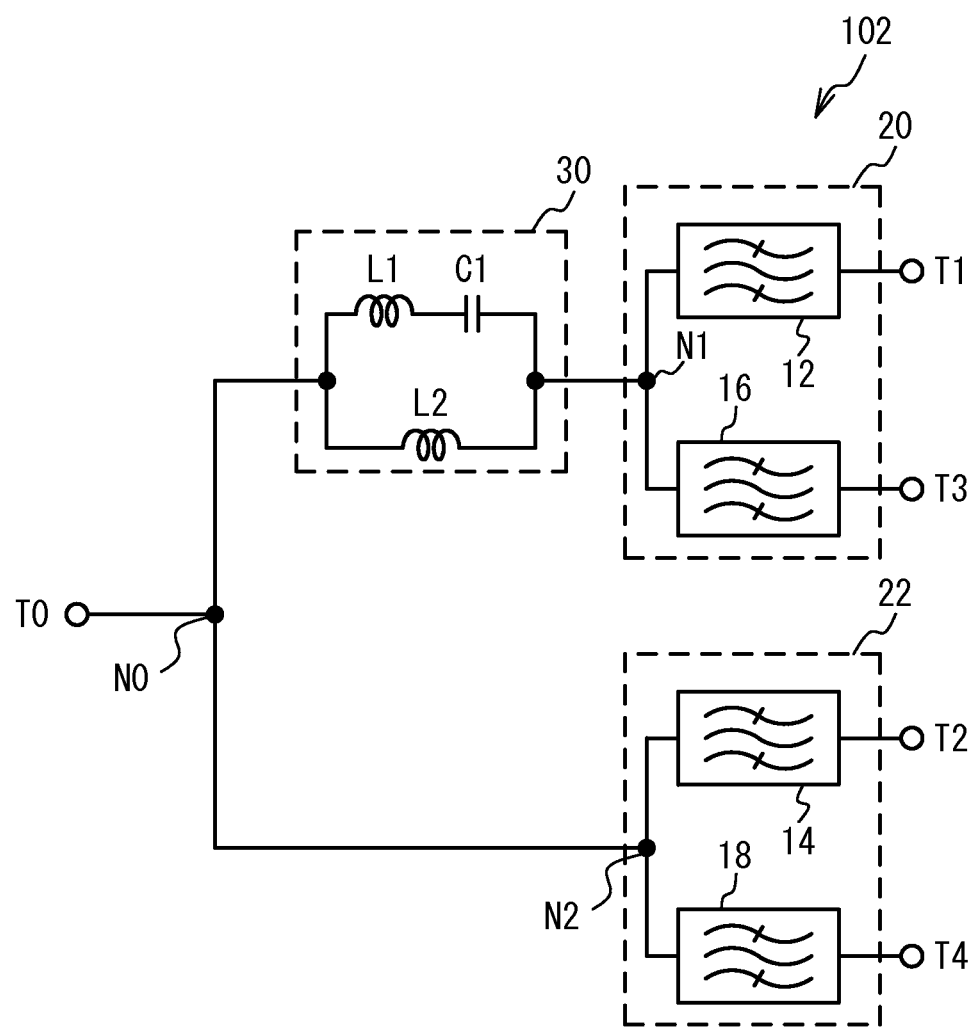
FIG. 14 is a block diagram of a duplexer in accordance with a second embodiment.

FIG. 14 is a block diagram of a quadplexer in accordance with a second embodiment. As illustrated in FIG. 14, a quadplexer 102 includes duplexers 20 and 22. The duplexer 20 includes filters 12 and 16, and the duplexer 22 includes filters 14 and 18. The filter 12 is connected between a node N1 and the terminal T1, and the filter 16 is connected between the node N1 and a terminal T3. The filter 14 is connected between a node N2 and the terminal T2, and the filter 18 is connected between the node N2 and a terminal T4. Other configurations are the same as those of the first embodiment, and thus the description is omitted.

Simulated were pass characteristics of the filters 12, 14, 16, and 18. The duplexer 20 was assumed to be a duplexer for Band 1, the filter 12 was assumed to be a receive filter for Band 1, and the filter 16 was assumed to be a transmit filter for Band 1. The duplexer 22 was assumed to be a duplexer for Band 3, the filter 14 was assumed to be a receive filter for Band 3, and the filter 18 was assumed to be a transmit filter for Band 3. The transmit filter 16 for Band 1 and the transmit filter 18 for Band 3 were assumed to be ladder-type filters using a surface acoustic wave resonator. The receive filter 12 for Band 1 and the receive filter 14 for Band 3 were assumed to be double-mode surface acoustic wave filters. The transmit band of Band 3 is from 1.710 GHz to 1.785 GHz, and the receive band of Band 3 is from 1.805 GHz to 1.870 GHz. The inductor L1 was assumed to have an inductance of 6.8 nH, the inductor L2 was assumed to have an inductance of 1.8 nH, and the capacitor C1 was assumed to have a capacitance of 0.9 pF. An inductor with an inductance of 3.0 nH was assumed to be connected between the node N1 and a ground as a matching circuit of the duplexer 20 for Band 1. An inductor with an inductance of 3.9 nH was assumed to be connected between the node N2 and a ground as a matching circuit of the duplexer 22 for Band 3. An inductor with an inductance of 6.8 nH was assumed to be connected between the terminal T2 and a ground. An inductor with an inductance of 8.2 nH was assumed to be connected between the terminal T4 and a ground.

Figure 15:
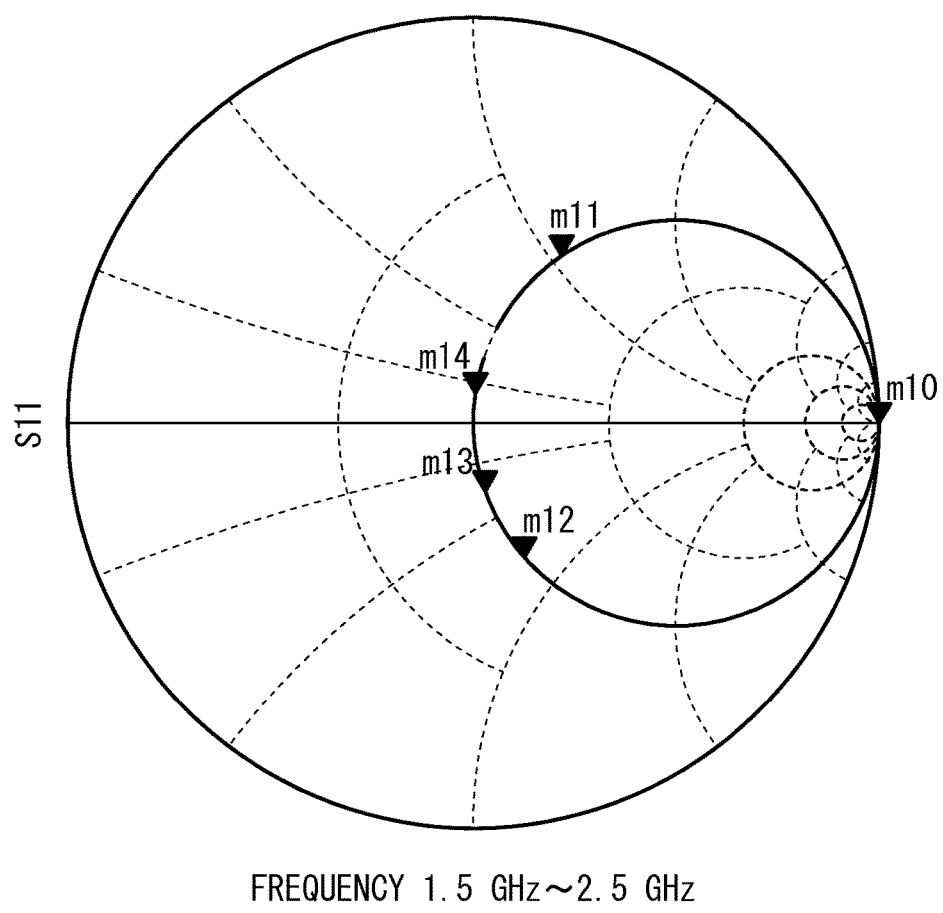
FIG. 15 is a Smith chart illustrating reflection characteristic S11 of a resonant circuit used in a simulation in the second embodiment.
Figure 16:
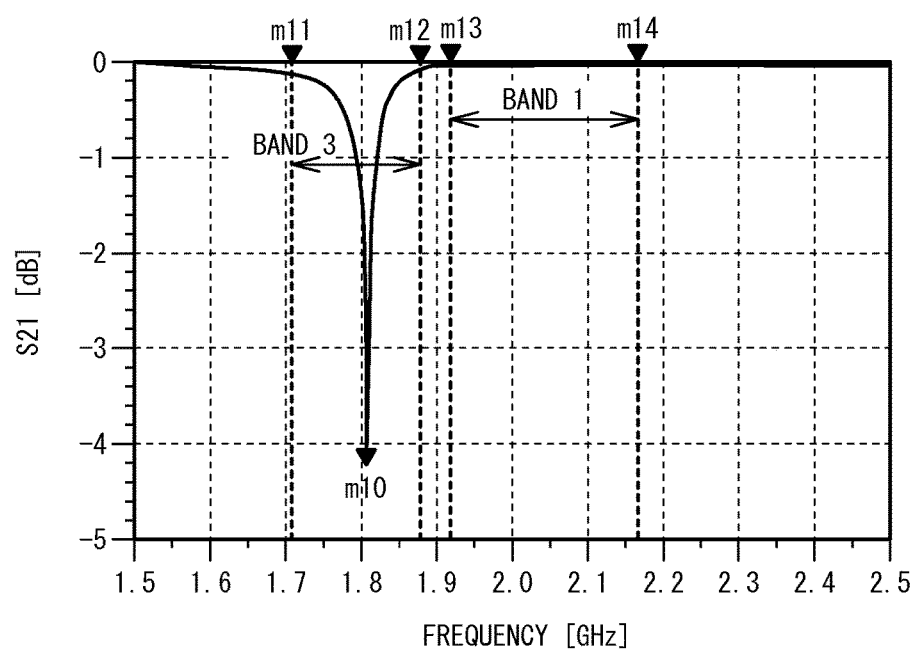
FIG. 16 is a diagram illustrating pass characteristic S21 of the resonant circuit used in the simulation in the second embodiment.

FIG. 15 is a Smith chart illustrating reflection characteristic S11 of a resonant circuit used in the simulation in the second embodiment. FIG. 16 is a diagram illustrating pass characteristic S21 of the resonant circuit used in the simulation in the second embodiment. As illustrated in FIG. 15 and FIG. 16, the band of Band 3 is lower in frequency than the band of Band 1. The antiresonant frequency (m10) of the resonant circuit 30 is 1.809 GHz, and is located in the band of Band 3. At the antiresonant frequency (m10), the magnitude of the reflection characteristic S11 is 1.000, the phase angle is 0.4 degree, and the pass characteristic S21 is −42.3 dB. At the lowest frequency of Band 3 (1.710 GHz indicated by a marker m11), the magnitude of the reflection characteristic S11 is 0.470, the phase angle is 61.9 degrees, and the pass characteristic S21 is −1.086 dB. At the highest frequency of Band 3 (1.880 GHz indicated by a marker m12), the magnitude of the reflection characteristic S11 is 0.362, the phase angle is −68.8 degrees, and the pass characteristic S21 is −0.610 dB. At the lowest frequency of Band 1 (1.920 GHz indicated by a marker m13), the magnitude of the reflection characteristic S11 is 0.185, the phase angle is −79.4 degrees, and the pass characteristic S21 is −0.151 dB. At the highest frequency of Band 1 (2.170 GHz indicated by a marker m14), the magnitude of the reflection characteristic S11 is 0.077, the phase angle is 85.6 degree, and the pass characteristic S21 is −0.026 dB.

As described above, the reflection coefficients of the resonant circuit 30 in the passbands of the transmit filter 18 and the receive filter 14 for Band 3 are greater than the reflection coefficients of the resonant circuit 30 in the passbands of the transmit filter 16 and the receive filter 12 for Band 1.

Figure 17A:
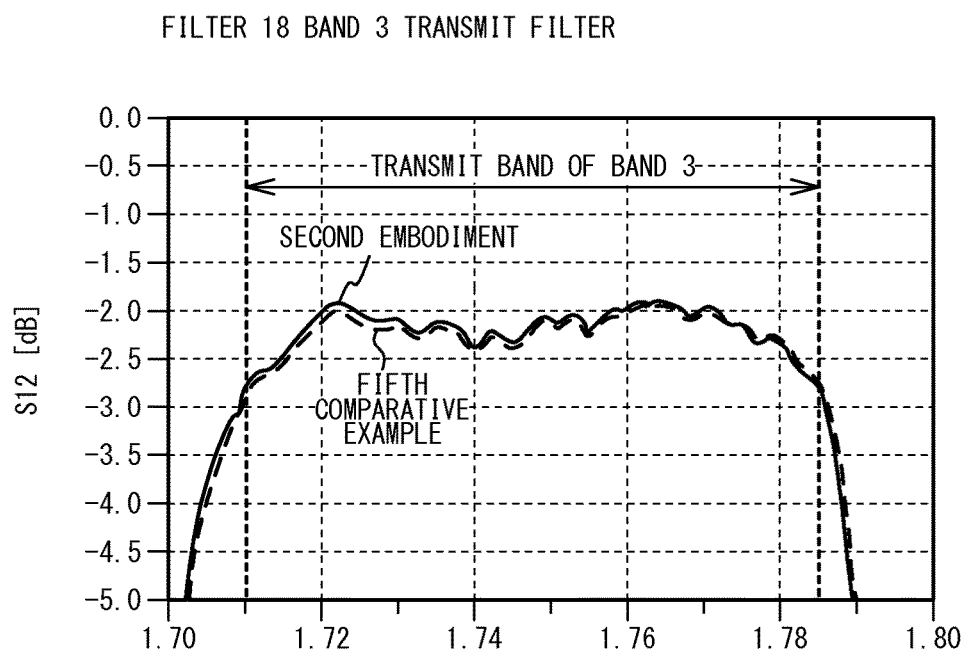
FIG. 17A is a diagram illustrating pass characteristics of transmit filters for Band 3 in the second embodiment and a fifth comparative example.
Figure 17B:
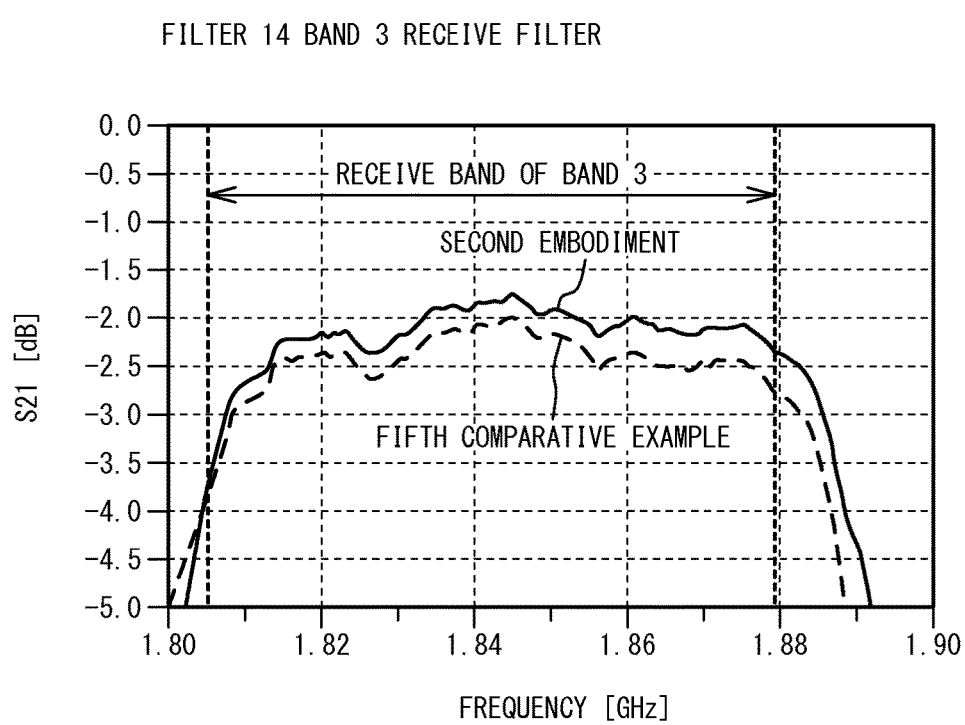
FIG. 17B is a diagram illustrating pass characteristics of receive filters for Band 3 in the second embodiment and the fifth comparative example.
Figure 18A:
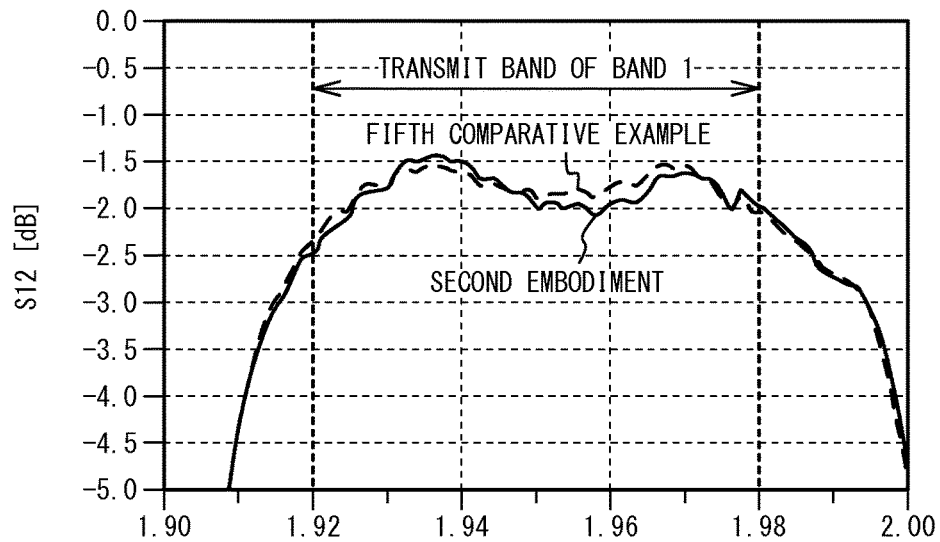
FIG. 18A is a diagram illustrating pass characteristics of transmit filters for Band 1 in the second embodiment and the fifth comparative example.
Figure 18B:
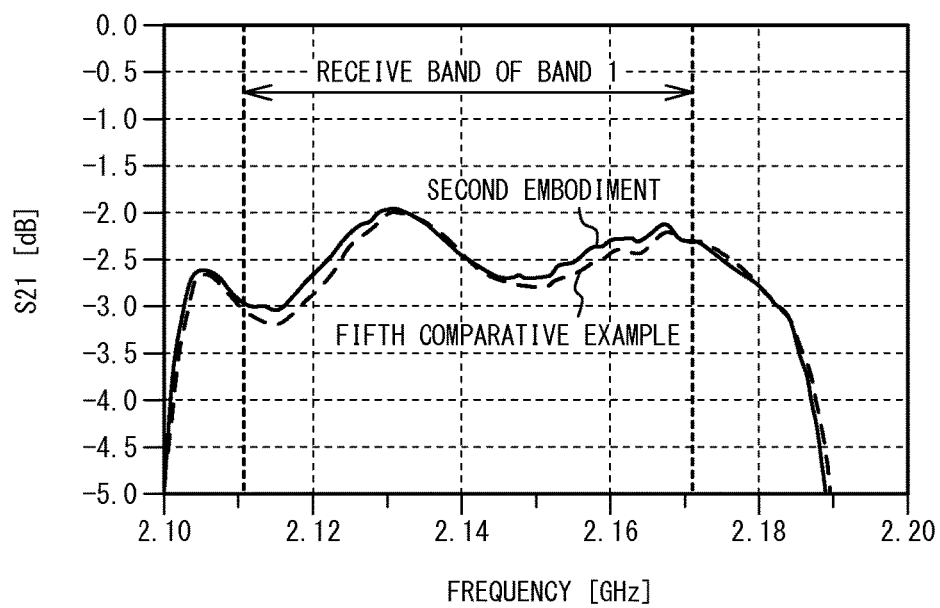
FIG. 18B is a diagram illustrating pass characteristics of receive filters for Band 1 in the second embodiment and the fifth comparative example.

FIG. 17A is a diagram illustrating pass characteristics of the transmit filters 18 for Band 3 in the second embodiment and a fifth comparative example, and FIG. 17B is a diagram illustrating pass characteristics of the receive filters 14 for Band 3. The pass characteristic of the filter 18 corresponds to the pass characteristic of a signal that reaches the common terminal T0 from the terminal T4, and the pass characteristic of the filter 14 corresponds to the pass characteristic of a signal that reaches the terminal T2 from the common terminal T0. FIG. 18A is a diagram illustrating pass characteristics of the transmit filters 16 for Band 1 in the second embodiment and the fifth comparative example, and FIG. 18B is a diagram illustrating pass characteristics of the receive filters 12 for Band 1. The pass characteristic of the filter 16 corresponds to the pass characteristic of a signal that reaches the common terminal T0 from the terminal T3, and the pass characteristic of the filter 12 corresponds to the pass characteristic of a signal that reaches the terminal T1 from the common terminal T0. The fifth comparative example is a quadplexer without the resonant circuit 30.

As illustrated in FIG. 17B, the loss in the passband of the receive filter 14 for Band 3 in the second embodiment is less than that in the fifth comparative example by approximately 0.5 dB. As illustrated in FIG. 17A, FIG. 18A, and FIG. 18B, the loss in the passband of the transmit filter 18 for Band 3, the loss in the passband of the receive filter 12 for Band 1, and the loss in the passband of the transmit filter 16 for Band 1 are approximately the same between the second embodiment and the fifth comparative example. As described above, in the quadplexer using two duplexers 20 and 22, the loss in a lower passband can be reduced, and the loss in a higher passband can be reduced.

In the second embodiment, the filter 16 (third filter) having a passband higher in frequency than the passband of the filter 14 is connected between the node N1 and the terminal T3 (third terminal) as illustrated in FIG. 14. The passband of the filter 16 is higher in frequency than the antiresonant frequency (m10) of the resonant circuit 30 as illustrated in FIG. 16. This configuration enables to reduce the loss of the resonant circuit 30 in the passband of the filter 16. Therefore, the loss of the signal in the passband of the filter 16 that reaches the common terminal T0 from the terminal T3 can be reduced. In addition, the reflection coefficient of the resonant circuit 30 in the passband of the filter 14 is high. Thus, a signal in the passband of the filter 14 transmitted from the common terminal T0 is reflected by the resonant circuit 30 and transmitted through the filter 14 without reaching the filters 12 and 16. Accordingly, the loss of the signal in the passband of the filter 14 that reaches the terminal T2 from the common terminal T0 is reduced.

Moreover, the filter 18 (fourth filter) having a passband lower in frequency than the passband of the filter 12 is connected between the node N2 and the terminal T4 (fourth terminal). This configuration allows the reflection coefficient of the resonant circuit 30 in the passband of the filter 18 to be high. Thus, the resonant circuit 30 can reflect a signal in the passband of the filter 18 transmitted through the filter 18 to reach the filter 12. Accordingly, the leakage of the signal in the passband of the filter 18 to the filter 12 is reduced, and the loss in the passband of the filter 12 due to the insertion of the resonant circuit 30 is reduced.

The second embodiment is an exemplary quadplexer using four filters, but may be a triplexer using three filters or a multiplexer using five or more filters.

In the first and second embodiments, the filters 12, 14, 16, and 18 may be, for example, surface acoustic wave resonators, boundary acoustic wave resonators, Love wave resonators, or piezoelectric thin film resonators. The filters 12, 14, 16, and 18 may be, for example, ladder-type filters or multimode type filters.

Although the embodiments of the present invention have been described in detail, it is to be understood that the various change, substitutions, and alterations could be made hereto without departing from the spirit and scope of the invention.

What is claimed is:

1. A multiplexer comprising:
a first filter connected between a common terminal and a first terminal;
a second filter connected between the common terminal and a second terminal, and having a passband lower in frequency than a passband of the first filter; and
a resonant circuit including:
a first inductor and a capacitor connected in series between a first end and a second end of the resonant circuit, the first end being coupled to a node at which the common terminal diverges into the first filter and the second filter, the second end being coupled to the first filter, and
a second inductor connected in parallel to the first inductor and the capacitor between the first end and the second end,
wherein the passband of the first filter is higher in frequency than an antiresonant frequency of the resonant circuit.

2. The multiplexer according to claim 1, wherein the passband of the second filter is higher in frequency than the antiresonant frequency of the resonant circuit.

3. The multiplexer according to claim 1, wherein the resonant circuit does not have a pathway coupled to a ground.

4. The multiplexer according to claim 1, wherein a reflection coefficient of the resonant circuit in the passband of the first filter is less than a reflection coefficient of the resonant circuit in the passband of the second filter.

5. The multiplexer according to claim 1, further comprising:
a fourth filter connected between the common terminal and a fourth terminal, and having a passband lower in frequency than the passband of the first filter.

6. The multiplexer according to claim 1, wherein the resonant circuit includes neither interdigital transducer nor piezoelectric thin film resonator.

7. A multiplexer comprising:
a first filter connected between a common terminal and a first terminal;
a second filter connected between the common terminal and a second terminal, and having a passband lower in frequency than a passband of the first filter; and
a resonant circuit including:
a first inductor and a capacitor connected in series between a first end and a second end of the resonant circuit, the first end being coupled to a node at which the common terminal diverges into the first filter and the second filter, the second end being coupled to the first filter, and
a second inductor connected in parallel to the first inductor and the capacitor between the first end and the second end,
wherein the passband of the first filter is higher in frequency than an antiresonant frequency of the resonant circuit, and
wherein the antiresonant frequency of the resonant circuit is not located in the passband of the second filter.

8. A multiplexer comprising:
a first filter connected between a common terminal and a first terminal;
a second filter connected between the common terminal and a second terminal, and having a passband lower in frequency than a passband of the first filter; and
a resonant circuit including:
a first inductor and a capacitor connected in series between a first end and a second end of the resonant circuit, the first end being coupled to a node at which the common terminal diverges into the first filter and the second filter, the second end being coupled to the first filter, and
a second inductor connected in parallel to the first inductor and the capacitor between the first end and the second end,
a third filter connected between the second end of the resonant circuit and a third terminal, and having a passband higher in frequency than the passband of the second filter,
wherein the passband of the first filter is higher in frequency than an antiresonant frequency of the resonant circuit, and
wherein the passband of the third filter is higher in frequency than the antiresonant frequency of the resonant circuit.

* * * * *